United States Patent [19]
Pedall

[11] Patent Number: 5,235,739
[45] Date of Patent: Aug. 17, 1993

[54] APPARATUS FOR EQUIPPING PRINTED CIRCUIT BOARDS

[75] Inventor: Friedrich Pedall, Karlsdorf-Neuthard, Fed. Rep. of Germany

[73] Assignee: Siemens Aktiengesellschaft, Munich, Fed. Rep. of Germany

[21] Appl. No.: 827,059

[22] Filed: Jan. 28, 1992

[30] Foreign Application Priority Data

Jan. 28, 1991 [DE] Fed. Rep. of Germany ....... 4102458

[51] Int. Cl.⁵ .............................................. H05K 3/30
[52] U.S. Cl. ........................................ 29/740; 29/759
[58] Field of Search .......... 29/740, 741, 759, 836–840, 29/832

[56] References Cited

U.S. PATENT DOCUMENTS

| | | | |
|---|---|---|---|
| 4,274,196 | 6/1981 | Lemmer | 29/741 |
| 4,520,557 | 6/1985 | Harigane et al. | 29/740 |
| 4,694,570 | 11/1985 | Rudolph et al. | |
| 4,794,689 | 1/1989 | Seno et al. | 29/740 |

FOREIGN PATENT DOCUMENTS

| | | |
|---|---|---|
| 2744235 | 9/1977 | Fed. Rep. of Germany . |
| 3221808 | 6/1982 | Fed. Rep. of Germany . |
| 3231174 | 8/1982 | Fed. Rep. of Germany . |
| 3405971 | 2/1984 | Fed. Rep. of Germany . |

*Primary Examiner*—Carl E. Hall
*Attorney, Agent, or Firm*—Hill, Steadman & Simpson

[57] ABSTRACT

An apparatus for automatic equipping of printed circuit boards with components includes at least two conveying elements arranged at a distance relative to one another along an endless drive. The conveying elements, which are preferably nipper-shaped grabbers, take the components from delivery devices in retrieving positions and conveys them to a transfer position at which they are transferred to an equipping head. The distances between the conveying elements on the endless drive is such that every retrieving position and every transfer position is approached independently of one another under the control of a programmed controller. Stretching of the endless drive, thus, does not deteriorate the exact approach of the retrieving positions and transfer positions.

10 Claims, 3 Drawing Sheets

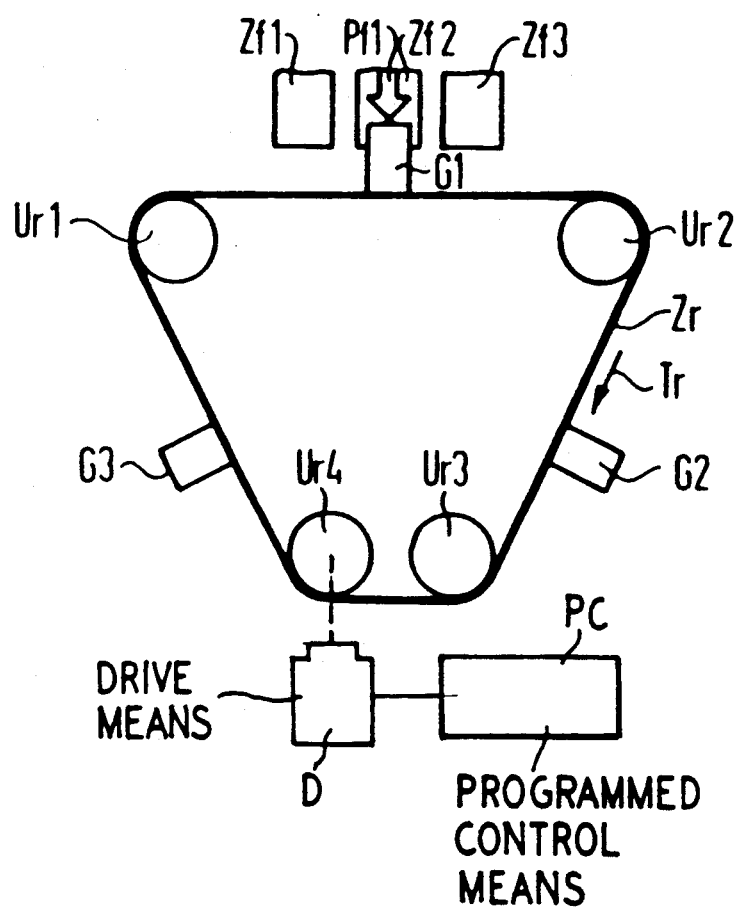

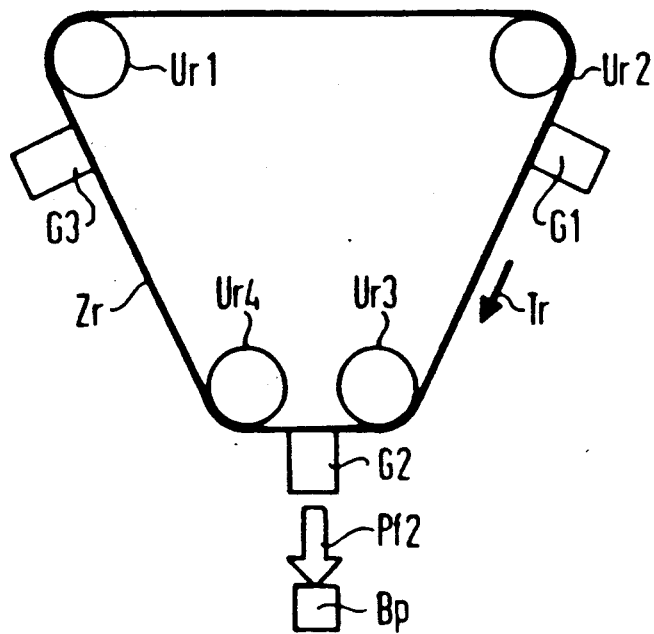
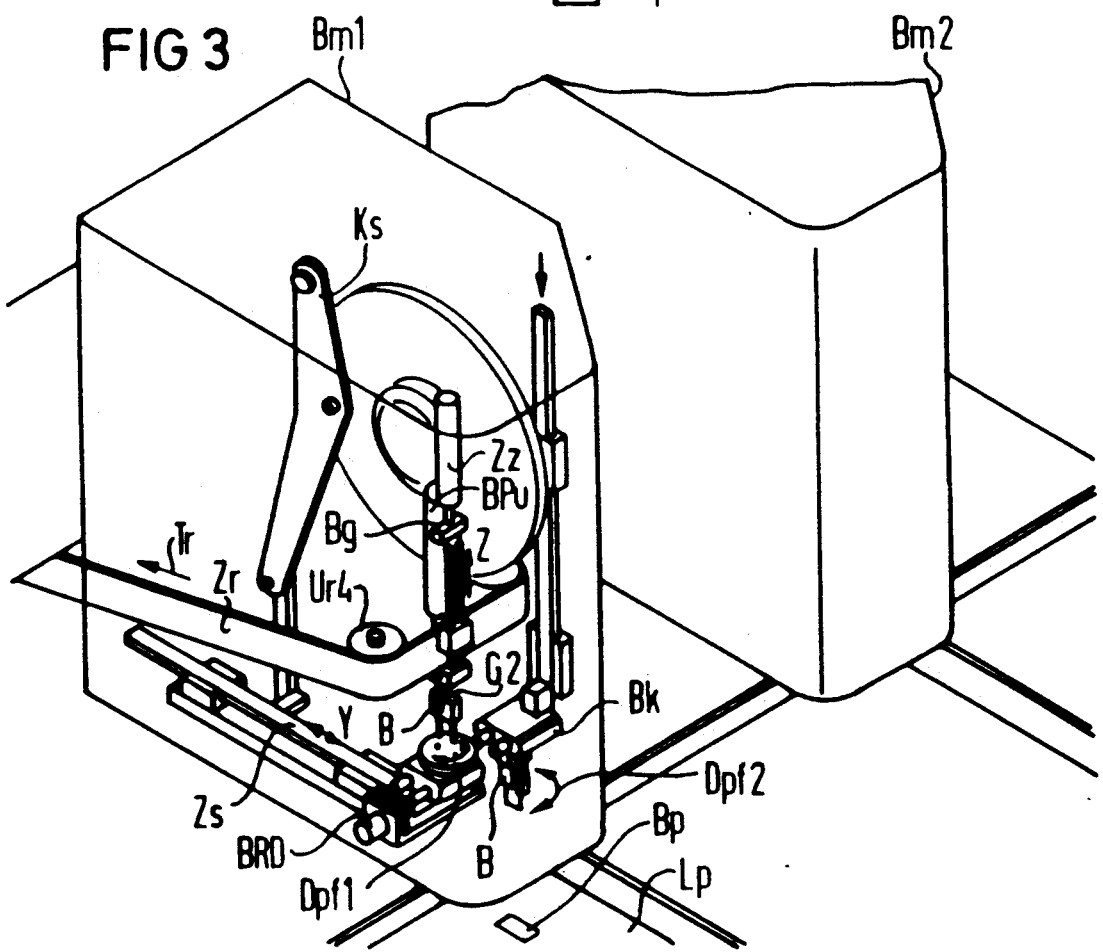

APPARATUS FOR EQUIPPING PRINTED CIRCUIT BOARDS

BACKGROUND OF THE INVENTION

1. Field of the Invention

The present invention relates generally to an apparatus for automatic mounting of components on printed circuit boards and, more particularly, to an apparatus for supplying components to a printed circuit board equipping head.

2. Description of the Related Art

German Patent Document 34 05 971 discloses an apparatus for equipping printed circuit boards with radially wired components. Cross bars arranged at identical spacings from one another in an endlessly circulating ladder-shaped drive pick up the components from a feeder device arranged along the endless drive at the same spacing. The components are conveyed by the endless drive to a transfer position in which an equipping head grasps the component and positions it at the appropriate equipping position on a printed circuit board. The endless drive is advanced in a clock fashion and the spatial distribution of the feeder devices and the equipping head are matched to one another so that a cross bar of the ladder-shaped drive is allocated to every feeder device and to the equipping head at every clock cycle.

German Patent Document 32 31 174 discloses an apparatus for equipping printed circuit boards with wired components in which an endlessly circulating chain carries pallets arranged at uniform spacings from one another. These pallets pick up components from a feeder arranged along the chain in the same spacing and convey them to a transfer position. An equipping head formed as a turret having a plurality of gripping elements picks up a component and positions it at an appropriate equipping position on a printed circuit board. The clocked advance of the endless chain and the spatial distribution of the feeder devices and the equipping head are matched to one another so that one of the pallets is allocated to each feeder means and to the equipping head after every clock cycle.

The known devices, thus, teach the simultaneous approach and operation of the conveying elements at the two component transfer positions. In the known apparatus for equipping printed circuit boards, division errors in the spacing between the conveying elements can arise due to stretching of the endless drive which is used for conveying the components. This stretching prevents an exact simultaneous approach of the retrieving position of the component feeder devices and of the transfer position of the equipping head by the component conveying devices and also prevents, or at least considerably deteriorates, the reliable transfer of the component therebetween. In other words, when the receiving position is reached by one of the conveying elements on the endless drive, the other conveying element may not be aligned accurately with the transfer position but instead may be slightly out of alignment so that faulty transfer of the component occurs.

SUMMARY OF THE INVENTION

The present invention guarantees a reliable feed of the components from various component feeder devices to the equipping head of an apparatus for equipping printed circuit boards with components. This is achieved by an apparatus that includes at least one delivery device for offering components in a retrieving position, at least two conveying elements arranged on an endless drive at a distance from one another, the conveying elements taking the components from the retrieving position and conveying them to a transfer position where they are discharged, and at least one equipping module having an equipping head for picking up the components at the transfer position and positioning them on a printed circuit board which has been aligned in an equipping position relative to the equipping head, the distances between the conveying elements being such that every retrieving position and every transfer position can be approached by every conveyor element independently of one another, preferably in program-controlled fashion.

The particular advantages achieved by the invention include the retrieving positions and transfer positions no longer being approached simultaneously by the conveying elements, but instead being approached sequentially by the conveying elements, independently of one another. Every retrieving position and every transfer position can, thus, be approached independently by every conveying element in a program-controlled fashion. In other words, the retrieving positions and the transfer positions are approached with extremely high precision and such an approach is not deteriorated by possible stretching of the endless drive on which the conveying elements are mounted.

Additional advantages of the invention are provided by further detailed features thereof. In particular, a toothed belt is preferably used as the endless drive on which the conveying elements are mounted, the toothed belt being capable of use as the endless drive with considerably greater accuracy than chains and the like, given adequate precision of the toothed belt.

Nipper-shaped, or plier-shaped, grabbers which are raisable and lowerable relative to the endless drive are preferably used as the conveying elements. The grabbers according to the present invention represent an especially simple and economical solution to the problem of engaging and holding the components during conveying.

To prepare the components within the equipping module for mounting on the circuit board and also to provide an extremely space-saving, compact overall equipping apparatus, the transfer position of the present apparatus includes a component aligning and rotating station integrated in the equipping module. The conveying elements deposit the components in the component aligning and rotating station where they are rotated and aligned to the desired position prior to the equipping head taking the components therefrom for mounting on the circuit board.

According to the present invention, a further possibility includes the utilization of at least three conveying elements arranged at a distance from one another along the endless drive and the provision of an additional station in the apparatus for either processing or testing of the components, the additional station preferably being arranged between the component retrieving position and the component transfer position relative to the conveying direction of the endless drive. The additional station is preferably arranged so that one of the conveying elements approaches the additional station as the transfer position is being approached by a preceding one of the conveying elements in programcontrolled fashion. To avoid losses of clock time, the additional station is independently approached in program-controlled fashion, like the retrieving positions and transfer positions.

BRIEF DESCRIPTION OF THE DRAWINGS

Exemplary embodiments of the invention are shown in the drawings, wherein:

FIG. 1 is a schematic representation in plan view of a conveying means for delivery of components to an equipping head, a conveying element thereof being shown in a component retrieving position;

FIG. 2 is a schematic plan view of the conveying means of FIG. 1 showing the conveying element in a component transfer position;

FIG. 3 is a partial perspective view of a conveying means utilizing the principles illustrated in FIGS. 1 and 2 for delivery of components to an equipping module, the housing of the equipping module being shown in phantom to reveal the conveying means and an integrated component aligning and rotating station therein;

DESCRIPTION OF THE PREFERRED EMBODIMENTS

Figure 4:
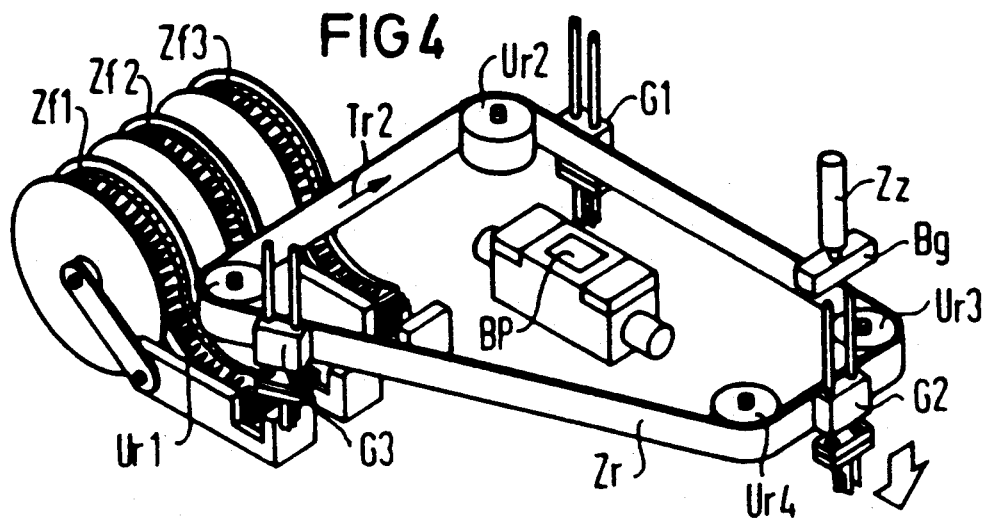
FIG. 4 is a perspective view of the conveying means of FIG. 3, including three component feeder means arranged side-by-side for feeding axially wired, belted components to the conveying means.

The automatic equipping of printed circuit boards with components provides that a number of geometrically similar but electrically different components should be capable of being supplied to an equipping head for mounting on the printed circuit board. To this end, conveying means according to the present invention are utilized, the operating principles thereof being set forth in greater detail with reference to FIGS. 1 and 2.

In FIG. 1, a conveying means including an endless drive formed by a toothed belt Zr that is conducted over deflection rollers Ur1, Ur2, Ur3 and Ur4 are arranged at the corners of a trapezoid. The endless toothed belt Zr carries three nipper-shaped grabbers G1, G2 and G3 arranged on the endless belt spaced from one another. When one of the deflection rollers Ur1–Ur4 is driven, the nipper-shaped grabbers G1–G3 are moved in a conveying direction Tr, as indicated by an arrow in FIG. 1. To accomplish movement of the belt Zr, a drive means D as shown schematically in FIG. 1 is connected to one of the rollers, such as the roller Ur4. In a preferred embodiment, the drive means D is controlled by a programmed control means PC so that the belt Zr is moved in program-controlled fashion.

In the illustrated example, the retrieving positions (which are not shown in detail in FIG. 1) at which the components are retrieved from delivery devices Zf1, Zf2 and Zf3 are situated at the longer of the two parallel sides of the trapezoid of the endless drive belt Zr. Each of the nipper-shaped grabbers G1–G3 can approach each of the retrieving positions of the delivery devices Zf1–Zf3 in program-controlled fashion, in other words under the control of the programmed controller PC, and can retrieve a corresponding component from the delivery devices. In the illustrated example, the retrieving position of the middle delivery device Zf2 has been approached by the nipper-shaped grabber G1, so that the nipper-shaped grabber G1 can pick up a component therefrom. The pick-up of a component is indicated in FIG. 1 by an arrow Pf1. At this point in time, the nipper-shaped grabber G2 is carrying a component previously taken from the delivery devices Zf1–Zf3, while the nipper-shaped grabber G3 is empty.

After the component is picked up by the nipper-shaped grabber G1, the toothed belt Zr is driven in the conveying direction Tr and the grabber G2 then approaches a transfer position (which is not shown in detail) in accordance with FIG. 2. Movement of the toothed belt Zr is, again, controlled by the programmed controller PC in program-controlled fashion, although the drive means and programmed control means are not shown in FIG. 2 for the sake of simplicity.

The transfer position illustrated in FIG. 2 is situated in the middle of the shorter parallel side of the trapezoid between the deflection rollers Ur3 and Ur4. In this transfer position, the grabber G2 transfers the component to an equipping head (to be described later), which places the component in an equipping position Bp on an allocated printed circuit board. The transfer of the component between the grabber G2 and the equipping head Bp is indicated in FIG. 2 by an arrow Pf2.

At this point in time, the nipper-shaped grabber G1 carries the component which has previously been taken from the delivery zone Zf2 as shown in FIG. 1, while the grabber G3 is still empty at this time. After the above-described transfer event in which the component is conveyed by the nipper-shaped grabber G2 to the equipping head Bp, the toothed belt Zr is driven in the conveying direction Tr and the grabber G3 approaches one of the retrieving positions of the delivery devices Zf1–Zf3 along the longer parallel side of the trapezoid under the control of the programmed controller. A component is taken therefrom, as previously described with reference to the example set forth above relative to the grabber G1, and each grabber in turn retrieves and transfers a component.

Three geometrically similar but electrically different components are selectively supplied to the equipping head Bp in the above-described way, each of the components being retrieved from a corresponding one of the delivery devices Zf1–Zf3. Of course, greater or fewer types of components may be retrieved, as needed, the separate approach of the positions making changing the number of types of components and the position of the retrieving positions relatively trouble free. The program-controlled approach of the conveying elements to the respective retrieving positions and to the transfer position thereby occurs with extremely high precision, since each is independent and not dependent on the approach of another conveying element to the other position.

In accordance with FIG. 3, the transfer of a component to the equipping head of an equipping module, which is merely indicated by the arrow Pf2 in FIG. 2, is carried out via a component aligning and turning station BRD integrated in the equipping module Bm1. As may be seen, the component aligning and rotating station BRD is moved into a transfer position by a delivery carriage Zs that is displacable in the Y-direction. The transfer position is approached under the control of the programmed controller by the nipper-shaped grabber G2 secured to the toothed belt Zr. By actuating a gripper cylinder Zz that is rigidly mounted in the quipping module Bm1, a beam-shaped actuation element Bt moves downward in a Z-direction and, thereby, effects a corresponding downward motion of the nipper-shaped grabber G2 and effects a transfer of the component B to the component aligning and rotation station BRD. The component aligning and rotation station BRD is supported in a rigidly arranged component pusher BPu. The transferred component B can be rotated 180° in either direction as needed, as indicated by the double arrow Dpf1 shown in FIG. 3.

After transfer and possible rotation of the component B, the delivery carriage Zs is driven via cam rocker Ks and moved in the Y-direction toward the front to the gripping position of the equipping head Bk. A second cam rocker, which is not shown in FIG. 3, drives the equipping head so that it moves down over the component nd grabs it. In the grabbed position, the lead wires of the component B1 are brought into a defined position relative to the equipping head Bk of the equipping module Bm1 in a standard way, for example, by plastic bending. The equipping head Bk then takes the component B from the component aligning and rotating station BRD and positions it in the equipping position Bp of the printed circuit board Lp by lowering in the Z-direction.

The component B is grabbed by the equipping head Bk and can be rotated by 90° in either direction by the equipping head Bk, as needed. This possibility is shown in the drawing by a double arrow Dpf2. As a result of the combination of the rotation possibilities Dpf1 and Dpf2, the component can be rotated by 360° in 90° steps.

A second equipping module Bm2 is arranged at a distance from the first equipping module Bm1, as shown in FIG. 3, so that an apparatus according to the present invention for equipping a printed circuit board may include two or more equipping modules.

FIG. 4 shows three delivery devices Zf1, Zf2 and Zf3 arranged side-by-side for delivering axially wired, belted components to respective retrieving positions. The respective required components are taken from the retrieving positions of the three delivery devices Zf1, Zf2 and Zf3 by the nipper-shaped grabbers G1, G2 and G3. The three delivery devices Zf1, Zf2 and Zf3 are constructed in the usual way. The nipper-shaped grabbers G1–G3 convey the components to the transfer position that, for example, is situated in the equipping module Bm1, as set forth in conjunction with FIG. 3. In the illustrated example, the nipper-shaped grabber G2 is situated just in this transfer position. As may also be seen, the spacing from the following nipper-shaped grabber G1 is dimensioned such that it is directly situated over an additional station for processing or for testing of the components when the grabber G2 approaches the transfer position under the control of the programmed controller. For example, an electrical function test of the component may be undertaken at the additional station Bp.

Figure 5:
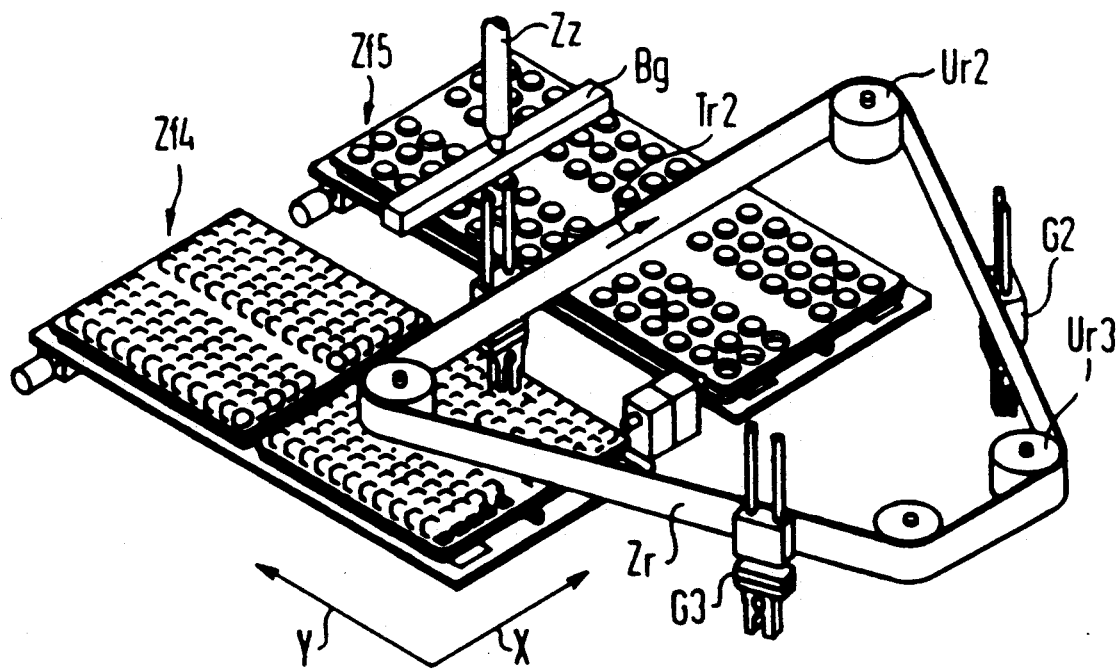
FIG. 5 is a perspective view of the conveying means of FIG. 3, including two planar component magazines arranged side-by-side as feeder devices for feeding various components to the conveying means.

In FIG. 5, the components are offered at two delivery stations Zf4 and Zf5 arranged side-by-side, the delivery stations being planar magazines or trays on which the components are arranged. For example, components, such as transformers, inductors and the like may be offered in the delivery devices Zf4 and Zf5 fashioned as planar magazines. In the illustrated example, the nipper-shaped grabber G1 has just approached a retrieving position allocated to the delivery device Zf4 in the X-direction in programcontrolled fashion, from which it then takes a corresponding component. The various components in the planar magazines are offered to the grabber G1 by displacing the magazines in the Y-direction. The actuation of the nipper-shaped grabber G1 is accomplished by a stationarily arranged gripper cylinder Zz having a beam-shaped actuation element Bg, which is wide enough so that it covers both of the retrieving positions allocated to the two delivery devices Zf4 and Zf5.

Thus, there is shown and described an automatic equipping apparatus for equipping printed circuit boards, wherein a plurality of geometrically similar but electrically different components may be supplied to an equipping head. At least two conveying elements are arranged at a distance relative to one another on an endless drive, the conveying elements taking the components from delivery devices corresponding to retrieving positions and conveying them to a transfer position and transferring them to an equipping head at the transfer position. The conveying elements are spaced from one another such that every retrieving position and every transfer position can be individually approached by every conveying element independently of one another. The conveying elements are preferably nipper-shaped grabbers. The exact approach of the retrieving positions and transfer positions is, thus, not deteriorated by a possible stretching of the endless drive.

Although various manor modifications may be suggested by those versed in the art, it should be understood that I wish to embody within the scope of the patent granted hereon all such modifications as reasonably and properly come within the scope of my contribution to the art.

I claim:

1. An apparatus for equipping printed circuit boards with components, comprising:
   a delivery means for offering the components in a component retrieving position;
   an endless drive extending between the component retrieving position and a component transfer position;
   at least two conveying elements on said endless drive, said at least two conveying elements being operable to take the components from the component retrieving position and convey the components to the component transfer position, said at least two conveying elements discharging the components at the transfer position, said at least two conveying elements being spaced from one another by a distance that differs from the distance between the retrieving position and the transfer position such that when one of said at least two conveying elements is in alignment opposite the component retrieving position then all others of said at least two conveying elements are out of alignment with the component transfer position and when one of said at least two conveying elements is in alignment opposite the component transfer position then all others of said at least two conveying elements are out of alignment with the component retrieving position; and
   an equipping module having an equipping head operable to pick up the components at the component transfer position and position the components on a printed circuit board that is aligned in an equipping position relative to said equipping head.

2. An apparatus as claimed in claim 1, wherein said endless drive comprises a toothed belt.

3. An apparatus as claimed in claim 1, wherein said at least two conveying elements comprise:
   nipper-shaped grabbers and means for alternately raising and lowering said nipper-shaped grabbers relative to said endless drive.

4. An apparatus as claimed in claim 1, further comprising:
a component aligning and rotating station integrated in said equipping module at the transfer position and adapted to receive the components deposited in said component aligning and rotating station by said at least two conveying elements, said component aligning and rotating station being operable to position the components for removal by said equipping head.

5. An apparatus as claimed in claim 1, wherein said at least two conveying elements comprise at least three conveying elements mounted on said endless drive at a distance from one another, and further comprising:
an additional station between the component receiving position and the component transfer position along said endless drive relative to a direction of travel of said endless drive, said additional station being positioned so that one of said conveying elements approaches said additional station as a preceding conveying element approaches the transfer position in program-controlled fashion.

6. An apparatus as claimed in claim 5, wherein said additional station is a component testing station.

7. An apparatus as claimed in claim 5, wherein said additional station is a component processing station.

8. An apparatus for conveying components from a component supply source to an equipping head for mounting on a printed circuit board, comprising:
an endless belt extending between the component supply source and the equipping head;
deflection rollers over which said endless belt extends for belt movement;
means for driving one of said deflection rollers to cause the belt movement of the endless belt therearound;
grabbers mounted on said endless belt, said grabbers being operable to engage a component in the component supply source when positioned thereover and being operable to release the component to the equipping head when positioned a the quipping head, said grabber being positioned along said endless belt at an interval different from an interval between the component supply source and the quipping head such that when one of said grabbers is in alignment with the component supply source all others of said grabbers are out of alignment with the equipping head and such that when one of said grabbers is in alignment with the equipping head all others of said grabbers are out of alignment with the component supply source; and
control means for controlling said means for driving to selectively individually position said grabbers over the component supply source and at the equipping head.

9. An apparatus as claimed in claim 8, wherein said deflection rollers are arranged in a trapezoid with a longer parallel side at the component supply source and a shorter parallel side at the equipping head.

10. An apparatus as claimed in claim 9, wherein said endless belt is a toothed belt.

* * * * *